(12) United States Patent
Hsieh

(10) Patent No.: US 8,933,740 B2
(45) Date of Patent: Jan. 13, 2015

(54) SEMI-DYNAMIC FLIP-FLOP

(71) Applicant: MStar Semiconductor, Inc., Hsinchu Hsien (TW)

(72) Inventor: Wen-Pin Hsieh, Hsinchu County (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/222,914

(22) Filed: Mar. 24, 2014

(65) Prior Publication Data

US 2014/0306743 A1 Oct. 16, 2014

(30) Foreign Application Priority Data

Apr. 10, 2013 (TW) .............................. 102112707 A

(51) Int. Cl.
*H03K 3/00* (2006.01)
*H03K 3/356* (2006.01)

(52) U.S. Cl.
CPC ...................................... *H03K 3/356* (2013.01)
USPC ............ 327/218; 327/200; 327/201; 327/208

(58) Field of Classification Search
USPC ......... 327/199–201, 208, 210–212, 214, 217, 327/218, 219; 326/95, 98
See application file for complete search history.

(56) References Cited

U.S. PATENT DOCUMENTS 5,917,355 A * 6/1999 Klass ............................ 327/208
2012/0133408 A1* 5/2012 Bazes ........................... 327/218

\* cited by examiner

*Primary Examiner* — Long Nguyen
(74) *Attorney, Agent, or Firm* — Edell, Shapiro & Finnan, LLC

(57) ABSTRACT

A semi-dynamic flip-flop is provided. A selecting circuit selects an input signal from a data signal and a test signal. A charging/discharging circuit charges/discharges an intermediate node according to the input signal, a clock signal and a modulation signal. A first storage circuit stores electric potential of the intermediate node. An adjusting circuit generates an adjustment signal according to the clock signal and the potential of the intermediate node. An output signal adjusts electric potential of an output node according to the clock signal and the potential of the intermediate node. A second storage circuit stores the potential of the output node. A reset circuit sets or resets the potential of the output node. A switch, connected between the adjusting circuit and the charging/discharging circuit, is turned on when the semi-dynamic flip-flop is in a normal operation mode.

2 Claims, 3 Drawing Sheets

| SN | RN | R | SR_EN | SR_ENB |
|---|---|---|---|---|
| L | L | H | H | L |
| H | L | H | H | L |
| L | H | L | H | L |
| H | H | L | L | H |

FIG. 3

SEMI-DYNAMIC FLIP-FLOP

This application claims the benefit of Taiwan application Serial No. 102112707, filed Apr. 10, 2013, the subject matter of which is incorporated herein by reference.

BACKGROUND OF THE INVENTION

1. Field of the Invention

The invention relates in general to a logic circuit, and more particularly to a technique for improving a semi-dynamic flip-flop.

2. Description of the Related Art

A semi-dynamic flip-flop, an element commonly applied in digital logic circuits, has a dynamic front end and a static rear end. FIG. 1 shows a typical semi-dynamic flip-flop circuit implemented by a complementary metal oxide semiconductor (CMOS). The flip-flop 100 in FIG. 1 includes a discharging circuit 111, a pre-charging circuit 112, an adjusting circuit 113, a first storage circuit 114, an output circuit 115 and a second storage circuit 116. The flip-flop 100 samples an input signal D according to a clock signal CK to produce sampled results as signals Q and QB. Operations of the flip-flop 100 are briefly described below.

When a falling edge of the clock signal CK appears, the flip-flop 100 enters a pre-charging phase. Through a transistor P1 in the pre-charging circuit 112, a power supply end VDD charges a node X to pull the voltage of the node X to a high level. The first storage circuit 114 stores the high level of the node X. Transistors P2 and N5 in the output circuit 115 are turned off, which is in equivalence disconnecting the connection between the intermediate node X and an output node Q, in a way that the second storage circuit 116 continues storing a previous status of the sampled result QB. As the clock signal CK becomes a low level, a delay clock signal CKD in the adjusting circuit 113 also becomes a low level. As such, an output node Y of the adjusting circuit 113 is then in high level that further turns on a transistor N3 in the discharging circuit 111. However, since a transistor N is turned off by the clock signal CK, the level of the node X remains unaffected regardless of the level of the input signal D.

When a rising edge of the clock signal CK appears, the flip-flop 100 enters an evaluation phase (i.e., a phase in which the flip-flop 100 samples the input signal D). At this point, if the input signal D is in low level, the level of the node X remains unaffected and is kept at a high level. If the node Q previously has a low level, no influence is posed on the sampled result QB when the transistor N5 is turned on. In contrast, if the node Q previously has a high level, the turning on of the transistor N5 pulls down the voltage of the node Q to a low level such that the sampled result QB becomes a high level. After a delay period contributed by three logic gates in the adjusting circuit 113 following the appearance of the rising edge of the clock signal CK, the node Y becomes a low level such that the transistor N3 is turned off. By turning on the transistor N3, the input signal D is prevented from changing from a high level to a low level, and the discharging circuit 111 discharges the node X. Such design provides the flip-flop 100 with an edge-triggered characteristic.

When the flip-flop 100 enters the evaluation phase, the discharging circuit 111 discharges the node X to a low level if the input signal D is in high level. The first storage circuit 114 later stores the low level of the node X. The node X with a reduced level turns on a transistor P2 in the output circuit 115, in a way that the node Y has a high level and the sampled result QB is in low level.

SUMMARY OF THE INVENTION

The invention is directed to a semi-dynamic flip-flop in which a reset function and a test function are added. By appropriately configuring logic elements in the circuit, a maximum operating speed of the semi-dynamic flip-flop of the present invention is not reduced even though new functions are added.

According to an embodiment of the present invention, a semi-dynamic flip-flop is provided. The semi-dynamic flip-flop includes a selecting circuit, a charging/discharging circuit, a first storage circuit, an adjusting circuit, an output circuit, a second storage circuit, a reset circuit and a switch. The selecting circuit selects an input signal from a data signal and a test signal according to a selection signal. The charging/discharging circuit, connected to an intermediate node, charges or discharges the intermediate node according to the input signal, a clock signal and an adjustment signal. The first storage circuit, connected to the intermediate node, stores electric potential of the intermediate node. The adjusting circuit, connected between the intermediate node and the charging/discharging circuit, generates the adjustment signal according to the clock signal and the potential of the intermediate node. The output circuit, connected between the intermediate node and an output node, adjusts electric potential of the output node according to the clock signal and the potential of the intermediate node. The second storage circuit, connected to the output node, stores the potential of the output node. The reset circuit resets or sets the potential of the output node. The switch is connected between the adjusting circuit and the charging/discharging circuit. When the reset circuit resets or sets the potential of the output node, the switch is set to disconnect a connection between the adjusting circuit and the charging/discharging circuit. When the semi-dynamic flip-flop is in a normal operation mode, the switch is set to be turned on.

The above and other aspects of the invention will become better understood with regard to the following detailed description of the preferred but non-limiting embodiments. The following description is made with reference to the accompanying drawings.

BRIEF DESCRIPTION OF THE DRAWINGS

FIG. 3 shows correspondence among signals in a control circuit according to an embodiment of the present invention.

DETAILED DESCRIPTION OF THE INVENTION

Figure 2:
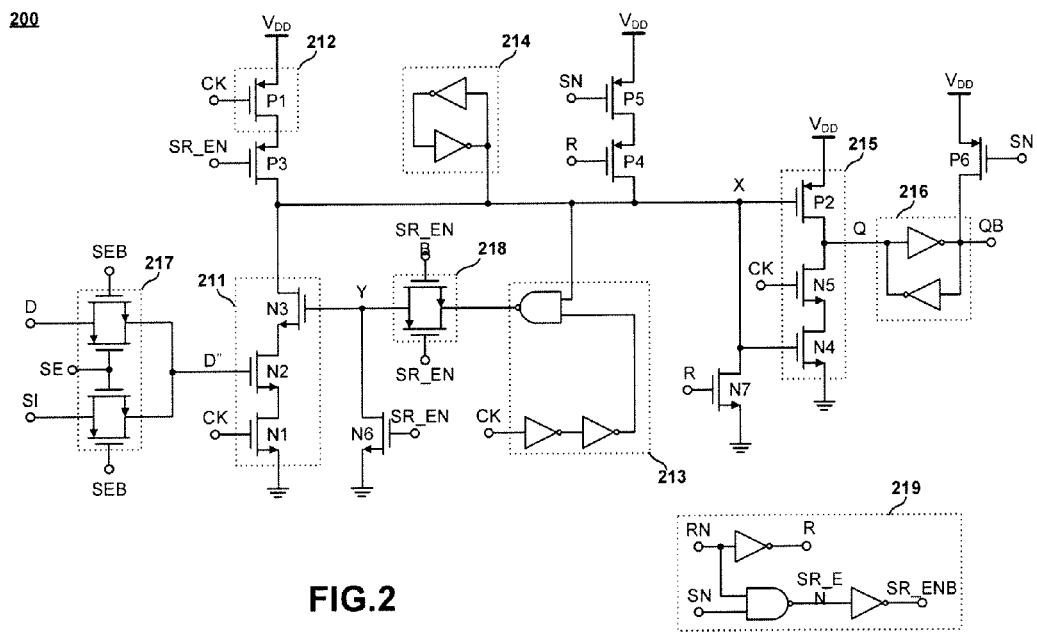
FIG. 2 is a circuit diagram of a semi-dynamic flip-flop according to an embodiment of the present invention.

FIG. 2 shows a circuit structure of a semi-dynamic flip-flop according to an embodiment of the present invention. A semi-dynamic flip-flop 200 includes a charging/discharging circuit (including a discharging circuit 211 and a pre-charging circuit 212), an adjusting circuit 213, a first storage circuit 214, an output circuit 215, a second storage circuit 216, a selecting circuit 217, a reset circuit (including transistors N6, N7, and P3 to P6), a switch 218 and a control circuit 219. In FIG. 2, for example, the switch 218 is represented by a transmission gate, i.e., a logic gate formed by an NMOS transistor and a PMOS transistor. In practice, the switch 218 may be implemented in other forms. The control circuit 219 is formed by two flip-flops and a NAND logic gate. In practice, the semi-dynamic flip-flop 200 may be integrated into an integrated circuit to collaboratively operate with other circuits, or may be an independent unit.

The first storage circuit 214 assists in storing electric potential of an intermediate node X. The second storage circuit 216 assists in storing potentials of output nodes Q and QB. In the embodiment, for example, the first storage circuit 214 and the second storage circuit 216 are formed by two flip-flops, respectively.

The semi-dynamic flip-flop 200 is used to sample an input signal D according to a clock signal CK to output sampled results as signals Q and QB. A set signal SN forcibly sets the sampled result QB to have a high level. A reset signal RN forcibly sets the sampled result QB to have a low level. In the selecting circuit 217, selection signals SE and SEB, which are mutually inverted (complementary), select one from a data signal D and a test signal SE as an input signal to the semi-dynamic flip-flop 200. One may select the test signal SI to replace the data signal D to eliminate the influences of the data signal D, so as to independently test whether the flip-flop 200 is working. Operations of the semi-dynamic flip-flop 200 are described below.

Figure 1:
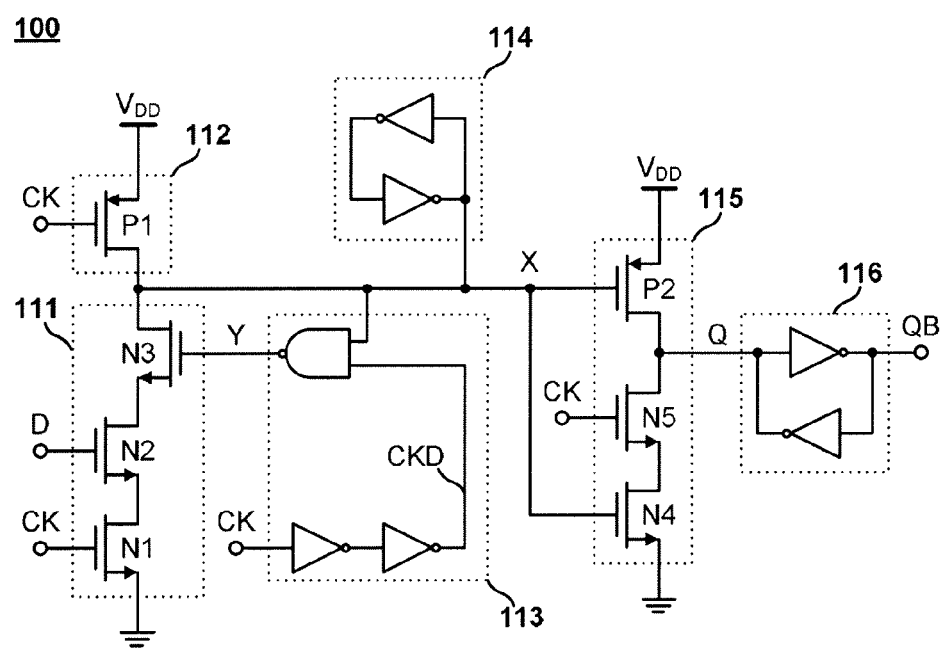
FIG. 1 is a typical semi-dynamic flip-flop implemented by a CMOS.

In the embodiment, when the set signal SN and the reset signal RN both are at high level, an enable signal SR_EN generated by the control circuit 219 is at low level. Under such conditions, the transmission gate 218 turns on to connect a node Y and the adjusting circuit 213. Further, as the enable signal SR_EN and a reset signal R (an inverted signal of the reset signal RN) are at low level, the transistors N6, N7 and P4 to P6 in the reset circuit are all turned off, whereas the transistor P3 is turned on. One person skilled in the art can easily understand that, the semi-dynamic flip-flop 200 under such conditions is in equivalence with the semi-dynamic flip-flop 100 in FIG. 1, and associated operations shall be omitted herein.

Figure 3:
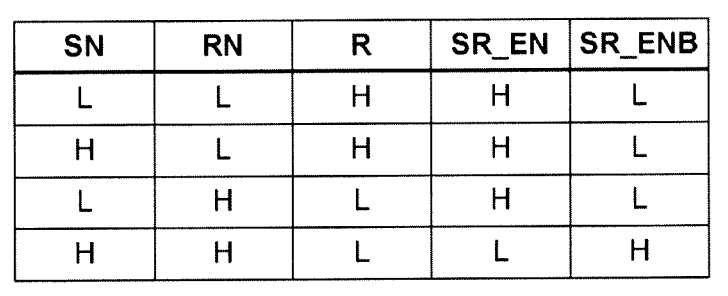

The input signals of the control circuit 219 are the set signal SN and the reset signal RN, and the output signals of the control circuit 219 are the reset signal R, the enable signal SR_EN and the inverted signal SR_ENB. The correspondence among these signals is as shown in FIG. 3. As seen from FIG. 2, due to the logic gate characteristics of the control circuit 219, when the set signal SN of the control circuit 219 is at low level or when the reset signal RN is at low level, the enable signal SR_EN generated by the control circuit 219 ist at high level. When the enable signal SR_EN is at high level, the transmission gate 218 is not conducted, and the transistor N6 in the reset circuit is definitely conducted and the transistor P3 in the reset circuit is definitely turned off. That is to say, whenever one of the set signal SN and the reset signal RN is at low level, the node Y is discharged to low level, and the discharging circuit 211 and the pre-charging circuit 212 no longer has any effect on the sampled signal Q/QB.

It should be noted that, in the embodiment, the set signal SN and the reset signal RN are configured not to be at low level at the same time.

When the set signal SN of the control circuit 219 is in low level and the reset signal RN of the control circuit 219 is in high level, the transistors P4 and P5, in the reset circuit, connected to a voltage source $V_{DD}$, are turned on (conducted), whereas the transistor N7 is turned off. Thus, the intermediate node X connected to the source of the transistor N7 is kept at high level. Further, the transistor P6 is turned on, and so the sampled signal QB is also at high level. As the transistor P2 is turned off and the transistor N4 is turned on, the node of the sampled signal Q is pulled down to low level when the clock signal CK is at high level. When the clock signal CK is at low level, the sampled signal Q is also maintained at a low level since the node of the sampled signal Q is located at the other end of the flip-flop that outputs the high-level QB. That is to say, no matter what level the clock signal is at (high level or low level), the output circuit 215 does not pull up the sampled signal Q to a high level. In other words, the sampled signal Q is forcibly set to low level, and the sampled signal QB is forcibly set to high level.

When the set signal SN is at high level and the reset signal RN is at low level, the transistors P4, P5 and P6 in the reset circuit are turned off, whereas the transistor N7 is turned on. Thus, the intermediate node X is configured to be at low level that allows the transistor P2 to conduct. Under such conditions, the sampled signal Q is forcibly set to have a high level, and the sampled signal QB is forcibly set to have a low level.

As seen from FIG. 2, the adjusting circuit 213 generates an adjustment signal according to the clock signal CK and the potential of the intermediate node X to control the transistor N3. One main function of the transmission gate 218 is to selectively exclude influences that the intermediate node X and the clock signal CK pose on the node Y. As such, the potential of the node Y is solely controlled by the transistor N6, thereby preventing the discharging circuit 211 from affecting the potential of the intermediate node X when the semi-dynamic flip-flop 200 is reset or set.

As previously stated, when the semi-dynamic flip-flop 200 enters the evaluation phase, the discharging circuit 211 discharges the intermediate node X to a low level if the input signal D is in high level. It should be noted that, when the transmission gate 218 is conducted, the transmission gate 218 also contributes certain time delay when the clock signal CK goes through the adjusting circuit 213 to the node Y. This additional time delay (compared to the circuit in FIG. 1) delays the time at which the transistor N3 is turned off, which is in equivalence increasing the time for allowing a signal D" to reach a stable state before the discharging circuit 211 stops discharging the intermediate X. Thus, although the selecting circuit 217 causes a delay in the time at which the data signal D or the test signal SI enters the discharging circuit 211 (i.e., reducing the time for allowing the signal D" to reach a stable state), the presence of the transmission gate 218 counterbalances such issue. Therefore, possibilities of lowering the maximum operating speed of the semi-dynamic flip-flop 200 due to the additional reset and test functions are minimized.

It should be noted that, in practice, the signal generated by the control circuit 219 may also be provided by an external circuit. In other words, the control circuit 219 is an optional element in the semi-dynamic flip-flop 200. Further, one person skilled in the art can appreciate that the detailed implementation of the circuit blocks is not limited to the example depicted in FIG. 2 For example, without changing logic operations of the semi-dynamic flip-flop 200, the discharging circuit 211, the pre-charging circuit 212 and the output circuit 215 may include greater numbers of transistors. Alternatively, the logic gate in the adjusting circuit 213 may be replaced by other element having the same operation logic.

As disclosed, a semi-dynamic flip-flop in which a reset function and a test function are added is provided by the present invention. By appropriately configuring logic elements in the circuit, a maximum operating speed of the semi-dynamic flip-flop of the present invention is not lowered even though new functions are added.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semi-dynamic flip-flop, comprising:
a selecting circuit, configured to select an input signal from a data signal and a test signal according to a selection signal;
a charging/discharging circuit, connected to an intermediate node, configured to charge or discharge the intermediate node according to the input signal, a clock signal and an adjustment signal;
a first storage circuit, connected to the intermediate node, configured to store potential of the intermediate node;
an adjusting circuit, connected between the intermediate node and the charging/discharging circuit, configured to generate the adjustment signal according to the clock signal and the potential of the intermediate node;
an output circuit, connected between the intermediate node and an output node, configured to adjust potential of the output node according to the clock signal and the potential of the intermediate node;
a second storage circuit, connected to the output node, configured to store the potential of the output node;
a reset circuit, configured to reset or set the potential of the output node; and
a switch, connected between the adjusting circuit and the charging/discharging circuit, being set to be turned off to disconnect a connection between the adjusting circuit and the charging/discharging circuit when the reset circuit resets or sets the potential of the output node, and being set to be turned on when the semi-dynamic flip-flop is in a normal operation mode.

2. The semi-dynamic flip-flop according to claim 1, wherein the switch is a transmission gate.

* * * * *